United States Patent [19]

Kidd

[11] Patent Number: 4,589,073
[45] Date of Patent: May 13, 1986

[54] APPARATUS FOR DETERMINING PROSPECTIVE SHORT CIRCUIT CURRENT

[75] Inventor: Alan L. Kidd, Southport, England

[73] Assignee: Dorman Smith Switchgear Limited, Great Britain

[21] Appl. No.: 491,294

[22] Filed: May 3, 1983

[30] Foreign Application Priority Data

May 5, 1982 [GB] United Kingdom ............... 8212989

[51] Int. Cl.⁴ .................... G06F 15/56; G01R 27/16; H02H 3/08
[52] U.S. Cl. .................................. 364/483; 361/63; 361/93; 364/481
[58] Field of Search ............. 361/80, 79, 27, 93, 361/96, 97, 63; 324/57 R; 323/319, 322; 364/480, 481, 482, 483, 185

[56] References Cited

U.S. PATENT DOCUMENTS

| | | | |
|---|---|---|---|
| 3,569,785 | 3/1971 | Durbeck et al. | 361/80 |
| 3,982,175 | 9/1976 | Sauvanet | 323/319 X |
| 4,073,009 | 2/1978 | Andow et al. | 364/483 X |
| 4,104,724 | 8/1978 | Dix et al. | 364/477 |
| 4,196,475 | 4/1980 | Hall | 324/57 R |
| 4,254,466 | 3/1981 | Jurek | 364/482 X |
| 4,276,605 | 6/1981 | Okamoto et al. | 364/483 |
| 4,342,063 | 7/1982 | Thörnell | 364/483 X |
| 4,432,030 | 2/1984 | Briccetti | 364/483 |
| 4,466,071 | 8/1984 | Russell, Jr. | 364/482 X |

FOREIGN PATENT DOCUMENTS

| | | | |
|---|---|---|---|
| 2704762 | 8/1977 | Fed. Rep. of Germany | 364/483 |
| 2609654 | 9/1977 | Fed. Rep. of Germany | 364/483 |
| 2068568 | 8/1981 | United Kingdom | 364/483 |
| 2097942 | 11/1982 | United Kingdom | 364/483 |

Primary Examiner—Felix D. Gruber
Attorney, Agent, or Firm—Parkhurst & Oliff

[57] ABSTRACT

An apparatus for determining the prospective short circuit current at any position in an electrical installation measures the voltage at a predetermined point or points of a half cycle of the operating voltage between conductors at any position in an electrical installation. A switching mechanism for connection and disconnection of an impedance between said conductors causes a current to flow therebetween for a short period, with the voltage measurement and actuation of the switching mechanism appropriately synchronized and sequenced. The differences in voltages caused by said current flow are measured and the differences in times of the half cycle caused by said current flow determined. A microprocessor having a random access memory (RAM) and a read only memory (ROM), stores the voltage measurements and time measurements in the RAM and uses a program previously stored in the ROM to derive the corresponding value of the prospective short circuit current. The microprocessor then displays the value on a display to provide direct reading of the short circuit current.

11 Claims, 5 Drawing Figures

Fig. 4.

| Display | Description |
|---|---|
| `240.3` `415.9` | SYSTEM VOLTAGE — 3 FIGURES + 1 DECIMAL. |
| `.2345` `23.45` | P.S.C.C. IN kA — UP TO 2 FIGURES + DECIMAL. |
| `.75PF` `.30PF` | POWER FACTOR — 2 DECIMAL PLACES + PF. |
| `hold` | INDICATES TIMER OPERATIONAL. DELAY NEXT READING UNTIL VOLTAGE READING RE-APPEARS. |
| `E` | MEASUREMENT ATTEMPTED ON A SYSTEM WITH PARAMETERS OUTSIDE THE OPERATING RANGE. |
| `nunu` | EXCESSIVE VOLTAGE VARIATION. |
| `////////` | EXCESSIVE FREQUENCY VARIATION. |

APPARATUS FOR DETERMINING PROSPECTIVE SHORT CIRCUIT CURRENT

BACKGROUND OF THE INVENTION

This invention relates to the protection against short circuit current between conductors of an electrical installation.

National and International Standards, in particular, the 15th Edition of the IEE Wiring Regulations, require that protective devices be provided in an electrical installation to break any short circuit current in conductors of each circuit of the installation before such current can cause danger due to thermal and mechanical effects produced in conductors and connections. To meet this requirement it is increasingly being specified that the prospective short circuit current at every relevant position of the complete electrical installation shall be ascertained.

In the specification of our published UK Patent Application No. 2097942A there is described and claimed a simple and inexpensive apparatus for determining the prospective short circuit current at any position in an electrical installation, which apparatus comprises means for measuring and storing the voltage at a predetermined point (e.g. the peak voltage) of a half cycle of the operating voltage between conductors at any position in an electrical installation; switching means for connection and disconnection of an impedance between said conductors to cause a current to flow therebetween for a short period; means for synchronising and sequencing operation of said voltage measuring means and actuation of said switching means; means for measuring the difference in voltage caused by said current flow; an indicating and/or recording device and, associated with said device, means for processing said voltage difference and applying it to said device for a period of sufficient length to enable the voltage difference to be displayed and/or recorded. Usually, but not necessarily, the indicating device has a scale so calibrated that a direct reading of the prospective short circuit current can be given.

In employing the apparatus of the aforesaid application to determine the prospective short circuit current at any position in an electrical installation, the value at a predetermined point (e.g. the peak value) of a half cycle of the operating voltage between conductors at the position in the electrical installation is measured and this voltage measurement is stored. A current is then caused to flow between the conductors for a short period, which current is of sufficient magnitude to effect a difference in the value of the operating voltage at the position and which voltage difference is a function of the prospective short circuit current at the position, and the voltage difference is displayed and/or recorded to provide an indication of the prospective short circuit current at the selected position in the electrical installation.

SUMMARY OF THE INVENTION

The apparatus of the aforesaid co-pending application, though eminently suitable for most requirements, does not compensate for any changes in power factor of an electrical installation under investigation and it is an object of the present invention to provide improved apparatus for determining prospective short circuit current at any position in an electrical installation, which apparatus will automatically take into account the power factor in providing an indication of the prospective short circuit current and will, if required, also provide an indication of the power factor itself.

According to the invention, the improved apparatus comprises means for measuring the voltage at a predetermined point or points (e.g. the peak voltage) of a half cycle of the operating voltage between conductors at any position in an electrical installation; switching means for connection and disconnection of an impedance between said conductors to cause a current to flow therebetween for a short period; means for synchronising and sequencing operation of said voltage measuring means and actuation of said switching means; means for measuring the differences in voltages caused by said current flow; means for determining the differences in times of the half cycle caused by said current flow; means associated with a random access memory and a read only memory, the random access memory storing said voltage measurements and time measurements and using a program previously stored in the read only memory to derive the corresponding value of prospective short circuit current and, coupled to the memory associated means, a display for providing direct reading of the short circuit current.

Preferably the apparatus also comprises means for determining a function indicative of the power factor of the electrical installation, the random access memory storing the power factor function and using a program previously stored in the read only memory to derive the corresponding value of power factor, which is also read on the display.

The display is preferably a digital display.

The memory associated means is preferably a microprocessor. Alternatively, the memory associated means may be a single chip microcomputer incorporating a microprocessor, the random access memory and the read only memory. In the former case, the read only memory is preferably detachably connected to the microprocessor so that the range and characteristics of the microprocessor can be readily modified by substitution of another read only memory.

The program stored in the read only memory may be such that the prospective short circuit current and, where required, power factor can be derived from predetermined values of voltage difference and time stored in the program (i.e. the program stores the predetermined values in the form of charts which list values of current and/or power factor for measured voltages and time). Alternatively the program may be such that the current and power factor can be determined by the calculation using the measured values of voltage difference and time.

The means for measuring the voltage between the conductors before and after the impedance is switched in may take direct readings of voltage. Preferably, however, the voltage measurement is made using a sample and hold circuit comprising a first switch, diode and capacitor connected in series across the conductors; and a second switch, diode and capacitor connected in series across the conductors. In this latter arrangement the first switch is closed before the impedance is connected across the conductors and the first capacitor allowed to charge to the peak voltage across the conductors without the impedance, then, after the impedance is connected, the second switch is closed and the second capacitor is allowed to charge to the peak voltage across the conductors with the impedance. The peak voltage difference between the two conditions can be measured from the difference in voltage across the first and second capacitors.

Preferably, the switching means includes a thyristor, which preferably switches a current of in excess of 100A through the impedance, which is preferably an accurate resistance. The higher the current the more realistic the measurements obtained. The microprocessor, where present, preferably activates a separate circuit (trigger circuit) to fire the thyristor, rather than fires the thyristor directly. As the thyristor may not produce a pure sinusoidal half wave (thyristors are renowned for producing a small voltage on the wrong side of zero volts at the end of a half cycle) making exact time measurement of the half cycle difficult, the means for measuring the time of the half cycle preferably only measures the time to a predetermined value of voltage on the half cycle, and the microprocessor, where present, calculates the time for the rest of the (pure) half cycle to reach zero, and adds the two values together to give a measurement of time for the half cycle.

Preferably, the apparatus has the facility to operate both on line and phase voltages, and for this purpose, a voltage level detector and indicators are provided.

The apparatus preferably also includes at least one protective device, e.g., a fuse.

The apparatus may be powered from the mains and/or at least one battery. The apparatus is preferably mounted in a portable case to which can be connected leads for connecting the apparatus between two conductors of an electrical installation. Preferably, the case is divided internally into two separate compartments, one of which contains all the components of the apparatus operating at the installation voltage and the other of which contains the remainder of the apparatus. Preferably, also, separate access is provided to each compartment of the case for maintenance and servicing.

One of the functions of the apparatus is to measure the impedance of the conductors. This measurement can obviously be affected by the impedance of the leads connecting the apparatus to the conductors. In order to compensate for the lead impedance, the lead impedance is preferably measured before the apparatus is connected to the conductors (by, for example, shorting the leads together) and the measured lead impedance stored in the random access memory. When the impedance of the conductors in an installation is measured, the lead impedance can be deducted to give a true reading of conductor impedance.

DESCRIPTION OF THE DRAWINGS

The invention is further illustrated by a description, by way of example, of preferred apparatus for determining the power factor of, and the prospective short circuit current at any position in, an electrical installation, with reference to the accompanying drawings, in which:

FIG. 4 is a series of illustrated examples of display messages on the digital display of the microprocessor of the apparatus shown in FIG. 1.

DETAILED DESCRIPTION OF THE PREFERRED EMBODIMENTS

Figure 1:
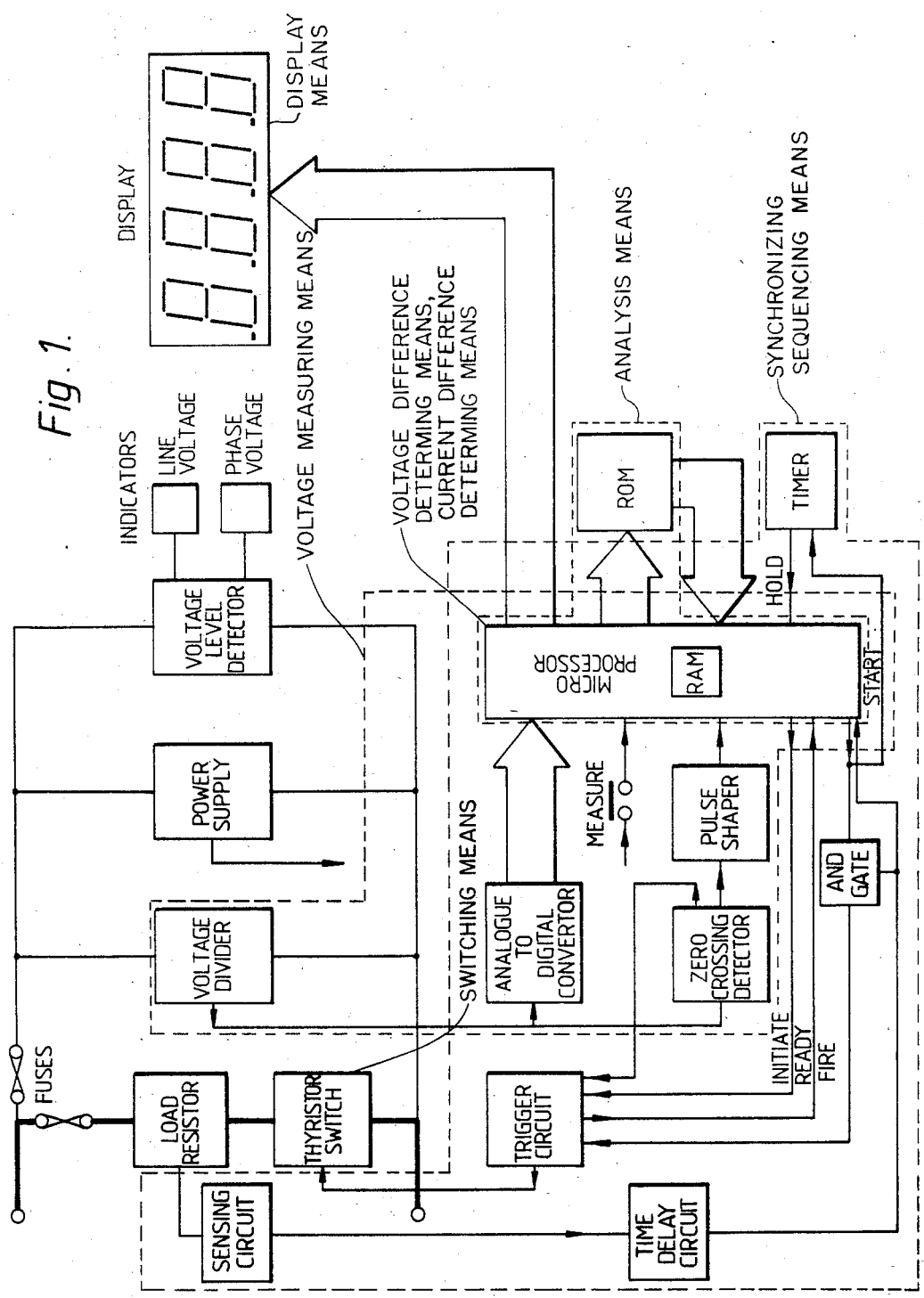
FIG. 1 is an annotated block diagram of the preferred apparatus.

The construction of the preferred apparatus will be apparent from the annotated block diagram shown in FIG. 1 and from the following description of the operation of the apparatus.

Referring to FIG. 1, the voltage of the electrical installation is fed via a voltage divider and an analogue to digital converter to a microprocessor associated with a read only memory (ROM) and a random access memory (RAM). In addition, the voltage of the electrical installation is fed to a zero crossing detector and a pulse shaper which also constitute an input to the microprocessor. The output of the microprocessor is fed to a four digit seven segment display and the output also provides a start signal for an external timer. Further outputs of the microprocessor initiate and fire a trigger circuit of a thyristor switch.

With two leads of the apparatus connected to two conductors at a selected position in an electrical installation at which the prospective short circuit current is to be measured, the two voltage indicators will identify the line or phase condition, that is the nominal voltage to which the prospective short circuit current is to be referred, and also the digital display will show the voltage of the electrical installation to an accuracy of one decimal place, the microprocessor having been initialised by the read only memory (ROM). On pressing the measure push button, the microprocessor switches to another program which will initiate the trigger circuit and wait until it receives a "ready" signal in return. The peak value of the voltage of the electrical installation occuring at a half cycle of the correct polarity to that which will cause current to flow through the thyristor circuit is then measured and is stored in the random access memory (RAM) of the microprocessor and the microprocessor then fires the trigger circuit at the appropriate voltage zero crossing. The consequent current flow for one half cycle via the load impedance causes the voltage at the terminals of the apparatus to drop by an amount depending upon the source impedance and the power factor. During this half cycle the peak voltage of the electrical installation is measured again and the difference between this figure and that of the preceding half cycle of the same polarity is stored in the random access memory (RAM) of the microprocessor.

Additional information relating to the power factor of the electrical installation is then identified using the apparatus in order to obtain an accurate indication of the prospective short circuit current at the selected position in the electrical installation. This can be done by either of two methods. In the first method, the time between the voltage zero of the electrical installation and the current zero is measured. Because it is not directly possible within the apparatus to detect the voltage zero of the electrical installation, this is achieved by reference to voltage zeros immediately before and after those of the half cycle of current flow and interpolating. The current zero is available for measurement because, as the apparatus has a known small inductance, the voltage across it passes through zero at a predetermined time interval to the current through it. In order to achieve accuracy for the relatively short time intervals involved, a zero crossing detector is employed for this purpose, the internal clock within the microprocessor enabling a sufficiently accurate measurement of this time to be made and stored. Over the range of current and power factors for which the apparatus is intended to be used, the time between the two zeros is likely to be between 10 and 1000 micro seconds. The time between the voltage zero of the electrical installation and the current zero is a function of the power factor of the installation. In the second method, the thyristor switch is triggered an accurate fixed time after the voltage zero of the electrical installation (say, a time lying in the range of 2 to 3 milliseconds for a 50 Hz system) in order that the current will increase as a modified exponential function; this will be clear from the mathematical analysis which follows. At least two samples of current are measured and stored in the random access memory (RAM) of the microprocessor during the transient period, i.e. before the instantaneous value of current is effectively equal to that which it would be if flowing continuously. A simple mathematical function of these, such as the quotient, is then extracted and stored in the microprocessor; this mathematical function is a function of the power factor of the installation.

Figure 2A:
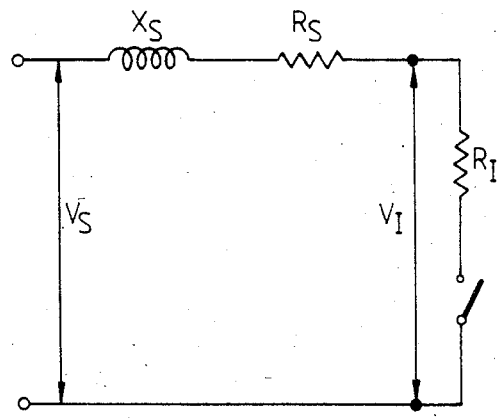
FIG. 2a shows a simple circuit diagram and FIG. 2b a voltage wave form employed in a mathematical explanation of the operation of the apparatus shown in FIG. 1.
Figure 2B:
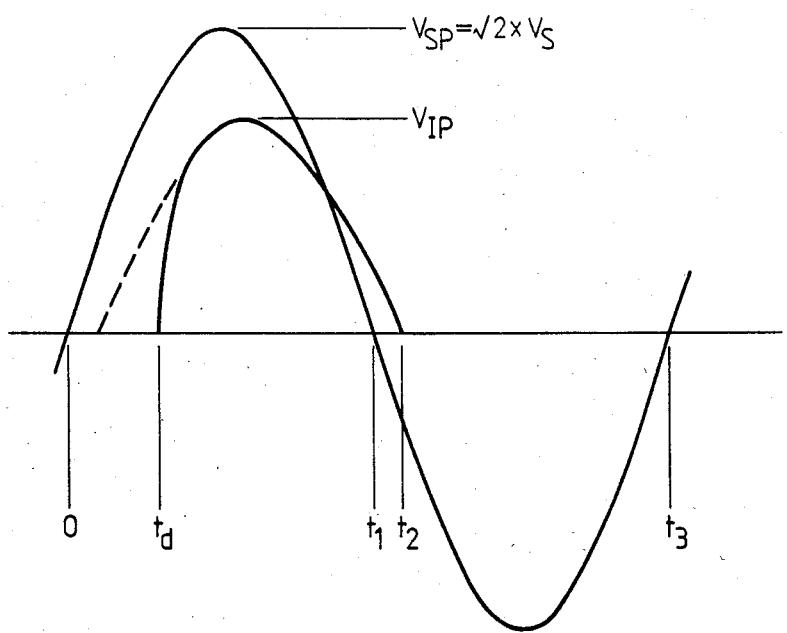

Referring to the simple circuit diagram and wave form shown in FIG. 2:

$$\text{Phase lag angle of current } A = \frac{t_2 - t_1}{t_1} \pi \text{ radians}$$

Since $t_1$ cannot be measured within the apparatus, but $t_3$ can, the expression may be written:

$$A = \frac{2t_2 - t_3}{t_3} \pi \text{ radians}$$

For the simplified case where the instrument impedance is purely resistive, if the prospective short circuit current is $I_{sc}$ amps r.m.s. and the power factor of the installation is PF, then:

$$I_{sc} = \frac{V_s}{\sqrt{(R_s^2 + X_s^2)}} \text{ and } PF = \frac{R_s}{\sqrt{(R_s^2 + X_s^2)}}$$

Also from above:

$$\tan A = \frac{X_s}{R_s + R_I}$$

$$= \frac{\frac{V_s}{I_{sc}} \cdot \sqrt{(1 - PF^2)}}{\left(\frac{V_s}{I_{sc}} \times PF\right) + R_I}$$

$$= \frac{\sqrt{(1 - PF^2)}}{PF + \left(\frac{I_{sc}R_I}{V_s}\right)}$$

If the instantaneous value of current is i amps at t it can be shown:

$$i = \frac{V_{sp}}{\sqrt{(R_s + R_I)^2 + X_s^2}} \cdot$$

-continued $$\sin(2\pi f(t + t_d) - A) - e^{\frac{-2\pi ft}{A}} \sin(2\pi f t_d - A)$$

where f is the frequency of the installation.

Also if the values of $t_d$ A, f and t are such that the transient component has decayed before the current peak is reached, it can be shown that:

$$V_{IP} = \frac{I_{sc}R_I \times \sqrt{2}}{\sqrt{\left(\frac{I_{sc}R_I}{V_s} + PF\right)^2 + 1 - PF^2}}$$

As will be seen from this mathematical analysis, whichever method is used to obtain a function proportional to the power factor of the electrical installation, the microprocessor has stored two values which together are a unique function of the prospective short circuit current and power factor of the electrical installation. For the first method, the time is fixed for a nominal voltage of the electrical installation. For the second method, the values of current are unique provided the timing of the initiating and sampling is fixed and the nominal voltages and frequency are known. The method by which the apparatus extracts the required information will now be explained.

Figure 3:
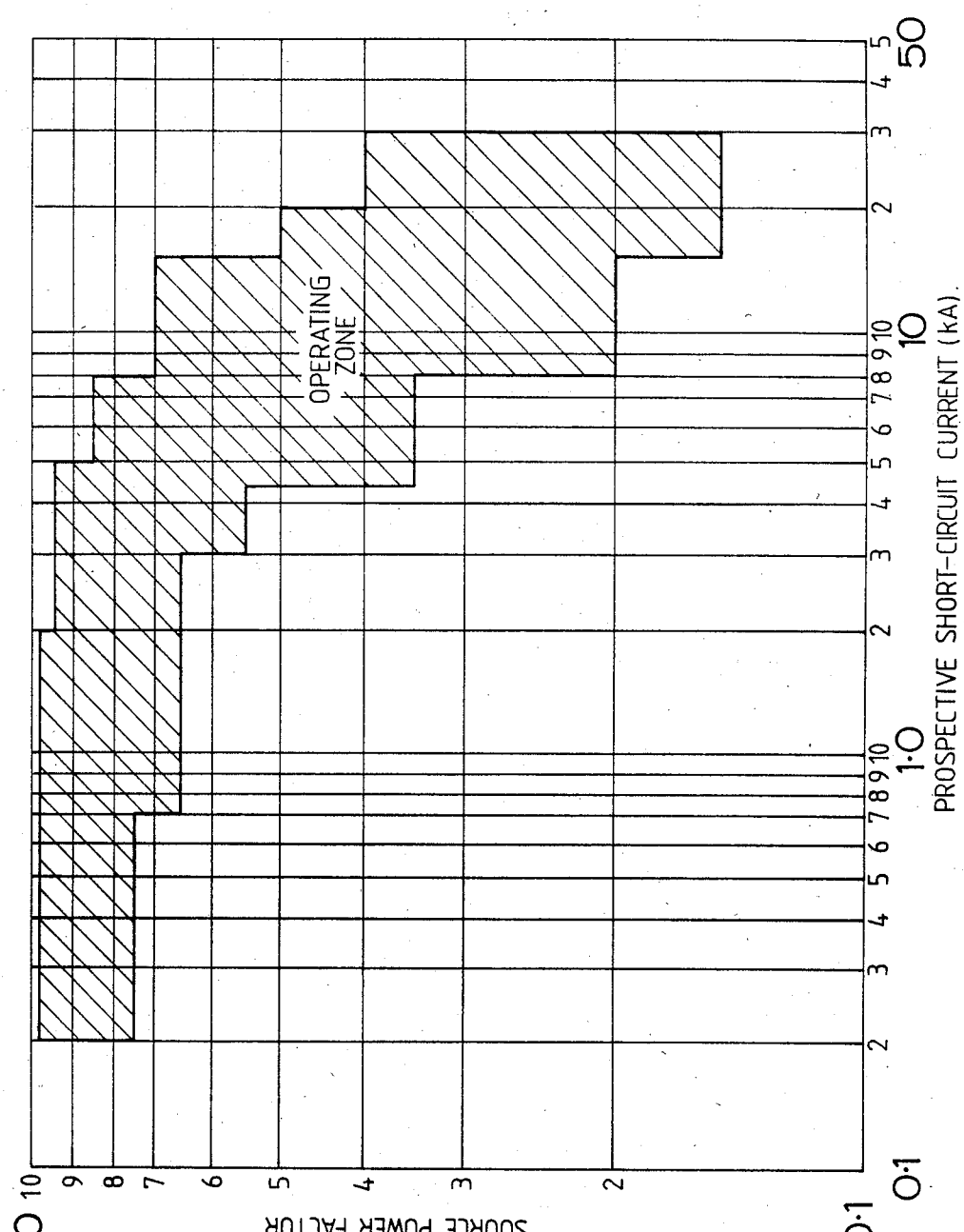
FIG. 3 is a graph of power factor against prospective short circuit current on which is defined a zone over which the apparatus shown in FIG. 1 will operate effectively.

As will be seen on referring to the graph shown in FIG. 3, a zone is defined over which the apparatus must work. This zone includes all the combinations of prospective short circuit currents and power factor which are likely to be found in practice and which can be defined quite readily on the basis of existing data of electrical installations. It is therefore possible to identify an element of the read only memory (ROM) with a particular set of values of prospective short circuit current and power factor and have loaded into the ROM two values corresponding to those derived from measurements of the electrical installation and stored within the microprocessor as already described. Thus, a number of memory addresses can be arranged to form effectively a mesh within the limits of which all likely measured values of the two stored quantities can be found. The microprocessor is programmed to search its memory for one of these quantities which approximates to the appropriate stored value and when one has been found, to proceed from node to node of the mesh until it has identified the area within which the values equivalent to those stored must lie. The microprocessor then switches to a simple iteration mode to interpolate the corresponding accurate values of prospective short circuit current and power factor. When complete, these are fed successively to the digital display, each being held for a few seconds in turn to enable them to be read.

FIG. 4 illustrates some examples of display messages that might be shown on the digital display. Three figures plus one decimal will always be a voltage; a maximum of two figures plus decimals will always be a reading of prospective short circuit current in kA and the power factor will always read as a decimal followed by two figures and the letters PF, for example 0.25PF. An error reading will show if the microprocessor cannot find appropriate values in the ROM and therefore the electrical installation or its measurement are abnormal. A further refinement is the zigzag indication which shows if the values of the peak voltage of the electrical installation over, say, three half cycles before and after that of current flow are outside a pre-set limit chosen to give a desired overall accuracy. A thermal protection circuit comprising a sensing circuit, time delay circuit and AND gate serves to inhibit firing of the thyristor switch for a period long enough to prevent excessive heating of the load impedance and if a second measurement is attempted within this period the microprocessor is programmed to display "hold" on the digital display. The thermal protection circuit is separate and external to the microprocessor because it must continue to time out in the absence of its power supply such as might occur if the apparatus were to be switched off or disconnected. Under these conditions, the apparatus must not be reset, as this would lead to rapid repeat firing of the thyristor switch and excessive heating of the load impedance.

The improved apparatus of the present invention has the important advantage that it is possible to extract enough information from an electrical installation to enable the prospective short circuit current at any position in the installation and its power factor to be evaluated. No complex extensive real time calculation needs to be done when the apparatus is used because selected results are stored in the read only memory (ROM) of the microprocessor in sufficient quantity to enable interpolation to the required accuracy. A further advantage lies in the fact that the read only memory (ROM) can be readily substituted by another ROM should it be required to modify the range or characteristics of the apparatus.

The preferred form of apparatus described and illustrated can be modified to achieve greater accuracy without altering the basic principle of operation. For example, if the conversion time from analogue to digital is not consistent, this can be overcome by the introduction of a precisely triggered sample and hold circuit at a preceding stage. Furthermore, if changes in the frequency of the electrical installation under investigation make the otherwise accurate measurement of time between current zeros liable to error, the microprocessor can be programmed to monitor the zero to zero time interval for two or three half cycles before and after current flow and either compensate for or indicate an error situation if the variation exceeds a preset limit. Further still, a single chip microcomputer may be used which comprises a microprocessor, RAM, ROM, timer and optionally an analogue to digital converter.

What we claim as our invention is:

1. Apparatus for determining the prospective short circuit current between conductors at any position in an electrical installation, comprising:
   means for measuring the voltage at at least one predetermined point of a half cycle of the operating voltage between the conductors;
   a load impedance;
   switching means for connection and disconnection of the load impedance between said conductors to cause a current to flow therebetween for a short period, said current flow being of sufficient magnitude to change the voltage between the conductors and the time duration of the half cycle;
   means for synchronising and sequencing operation of said voltage measuring means and actuation of said switching means;
   means for measuring the differences in voltages caused by said current flow;
   means for determining the differences in the time duration of the half cycle caused by said current flow;
   analysis means having a random access memory and a read only memory, the read only memory having stored therein predetermined values of voltage differences and time duration and corresponding predetermined values for the prospective short circuit current, the analysis means storing said voltage difference measurements and time duration difference measurements in said random access memory and comparing them with the predetermined values stored in the read only memory to derive the corresponding measured value of the prospective short circuit current between said conductors; and,
   display means coupled to said analysis means for displaying directly said measured value of the prospective short circuit current.

2. Apparatus as claimed in claim 1, wherein the apparatus also comprises means for determining a function indicative of the power factor of the electrical installation, the read only memory having stored therein predetermined values of the power factor function, the analysis means storing the power factor function in the random access memory and comparing it with the predetermined values stored in the read only memory to derive the corresponding value of power factor which is displayed on the display means.

3. Apparatus as claimed in claim 1, wherein the display is a digital display.

4. Apparatus as claimed in claim 1, wherein the analysis means comprises a microprocessor.

5. Apparatus as claimed in claim 4, wherein the read only memory is detachably connected to the microprocessor.

6. Apparatus as claimed in claim 1, wherein the analysis means comprises a single chip microcomputer comprising a microprocessor, the random access memory and the read only memory.

7. Apparatus as claimed in claim 1, wherein the switching means comprises a thyristor.

8. Apparatus as claimed in claim 7 wherein said analysis means comprises a microprocessor, and wherein the microprocessor activates a separate circuit to fire the thyristor.

9. Apparatus as claimed in claim 7, further comprising microprocessor, and wherein the means for measuring the time duration of the half cycle measures the time to a predetermined value of voltage on the half cycle, and the microprocessor calculates the time for the rest of the half cycle to reach zero, and adds the two values together to give a measurement of time for the half cycle.

10. Apparatus as claimed in claim 1, wherein the apparatus further comprises leads, and the impedance of the leads of the apparatus is measured before the apparatus is connected to the installation, and the measured lead impedance is stored in the random access memory.

11. Apparatus as claimed in claim 1, further comprising a thermal protection circuit for protecting said load impedance from overheating by inhibiting said switching means from connecting said load impedance between said conductors after measurements have been made for a period long enough to prevent excess heating of the load impedance.

* * * * *